United States Patent
Huang et al.

[11] Patent Number: 5,723,374
[45] Date of Patent: Mar. 3, 1998

[54] METHOD FOR FORMING DIELECTRIC SPACER TO PREVENT POLY STRINGER IN STACKED CAPACITOR DRAM TECHNOLOGY

[75] Inventors: Julie Huang; Mong-Song Liang, both of Hsin-Chu, Taiwan

[73] Assignee: Taiwan Semiconductor Manufacturing Company, Ltd., Hsin-Chu, Taiwan

[21] Appl. No.: 775,049

[22] Filed: Dec. 27, 1996

[51] Int. Cl.$^6$ .............................................. H01L 21/8242
[52] U.S. Cl. ...................... 438/253; 438/256; 438/666
[58] Field of Search .......................... 438/238, 253–258, 438/396–399, 666

[56] References Cited

U.S. PATENT DOCUMENTS

| | | | |
|---|---|---|---|
| 4,997,790 | 3/1991 | Woo et al. | 437/195 |
| 5,264,391 | 11/1993 | Son et al. | 437/195 |
| 5,364,811 | 11/1994 | Ajika et al. | 438/253 |
| 5,373,178 | 12/1994 | Motoyoshi et al. | 257/344 |
| 5,389,568 | 2/1995 | Yun | 438/253 |
| 5,413,950 | 5/1995 | Chen et al. | 438/253 |
| 5,489,546 | 2/1996 | Ahmad et al. | 437/57 |
| 5,512,502 | 4/1996 | Ootsuka et al. | 437/41 |

*Primary Examiner*—Jey Tsai
*Attorney, Agent, or Firm*—George O. Saile; Stephen B. Ackerman; Rosemary L. S. Pike

[57] ABSTRACT

A new method of avoiding the formation of a polysilicon stringer along the slope of the bit line contact hole edge is described. A gate electrode and associated source/drain regions are formed in and on the surface of a semiconductor substrate wherein the bit line contact is to be formed adjacent to the gate electrode. First spacers are formed on the sidewalls of the gate electrode. A first insulating layer over the gate electrode adjacent to the bit line contact has a first slope. Second spacers on the sidewalls of the first insulating layer adjacent to the bit line contact have a second slope less than the first slope. A second polysilicon layer is deposited overlying the gate electrode and patterned. A first dielectric layer and a third polysilicon layer is deposited overlying the second polysilicon layer. The third polysilicon layer is etched away where the bit line contact is to be formed. The gentler slope of the second spacers allows the third polysilicon layer to be etched away without leaving stringers. A bit line contact opening is etched through a second dielectric layer to the underlying semiconductor substrate wherein the bit line contact opening is separated from the third polysilicon layer by a thickness of the second dielectric layer. A fourth polysilicon layer is deposited within the contact opening to form the bit line contact.

18 Claims, 4 Drawing Sheets

METHOD FOR FORMING DIELECTRIC SPACER TO PREVENT POLY STRINGER IN STACKED CAPACITOR DRAM TECHNOLOGY

BACKGROUND OF THE INVENTION

(1) Field of the Invention

The invention relates to the fabrication of integrated circuit devices, and more particularly, to a method of avoiding polysilicon stringers along the slope of a bit line contact opening in the fabrication of integrated circuits.

(2) Description of the Prior Art

FIG. 1 illustrates a partially completed integrated circuit Dynamic Random Access Memory (DRAM) device of the prior art. Gate electrodes 12 have been formed on the surface of a semiconductor substrate 10. Capacitors 29 have been formed overlying the gate electrodes. The top electrode of the capacitors 29 is polysilicon layer 30. The polysilicon layer 30 is patterned to provide an opening for a bit line contact. Because of the steep slope of the dielectric layer 22, polysilicon stringers 30a remain in portions within the desired opening. Dielectric layer 34 is deposited and a contact opening is etched through the dielectric layer to the contact 13. Polysilicon layer 38 is deposited within the contact opening. The polysilicon stringers 30a are shorted to the polysilicon 38 causing failure of the polysilicon 30 isolation. Thus, the bit line 40 will be shorted to the polysilicon gate electrode 16 causing device failure.

U.S. Pat. 5,512,502 to Ootsuka et al shows the formation of a MISFET having a salicide structure where an insulating layer overlies the gate sidewall spacer. U.S. Pat. No. 5,489,546 to Ahmad et al shows a method of forming different sized spacers for PMOS and NMOS gate sidewalls. U.S. Pat. No. 5,264,391 to Son et al shows a method of forming a self-aligned contact using a polysilicon layer. U.S. Pat. No. 4,997,790 to Woo et al teaches a self-aligned contact having an insulating layer overlying gate spacers. U.S. Pat. No. 5,373,178 to Motoyoshi shows a MOSFET having a sidewall spacer on the gate section. None of these patents show or solve the problem of stringers along the slope of the bit line contact hole edge.

SUMMARY OF THE INVENTION

Accordingly, it is a principal object of the present invention to provide an effective and very manufacturable method of avoiding the formation of a polysilicon stringer along the slope of the bit line contact hole edge.

Another object of the present invention is to provide a method of maintaining good isolation of the bit line to polysilicon gate in the fabrication of a DRAM integrated circuit device.

Yet another object is to avoid the formation of a polysilicon stringer along the slope of the bit line contact hole edge by easing the slope of the contact hole edge with a pre-layer spacer.

In accordance with the objects of this invention a new method of avoiding the formation of a polysilicon stringer along the slope of the bit line contact hole edge by easing the slope of the contact hole edge with a pre-layer spacer is achieved. A first polysilicon layer is deposited over the surface of a semiconductor substrate and patterned to form a gate electrode wherein the bit line contact is to be formed adjacent to the gate electrode. First spacers are formed on the sidewalls of the gate electrode. A first insulating layer is deposited over the gate electrode and patterned wherein the first insulating layer adjacent to the bit line contact has a first slope. A second insulating layer is deposited over the first insulating layer. The second insulating layer is anisotropically etched to leave second spacers on the sidewalls of the first insulating layer wherein the second spacers adjacent to the bit line contact have a second slope less than the first slope. A second polysilicon layer is deposited overlying the gate electrode and patterned. A first dielectric layer is deposited over the second polysilicon layer. A third polysilicon layer is deposited overlying the first dielectric layer. The third polysilicon layer is etched away where the bit line contact is to be formed. The gentler slope of the second spacers allows the third polysilicon layer to be etched away without leaving stringers. A second dielectric layer is deposited over the third polysilicon layer. A bit line contact opening is etched through the first and second dielectric layers and the first insulating layer to the underlying semiconductor substrate wherein the bit line contact opening is separated from the third polysilicon layer by a thickness of the second dielectric layer. A fourth polysilicon layer is deposited overlying the second dielectric layer and within the contact opening to form the bit line contact in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 2:
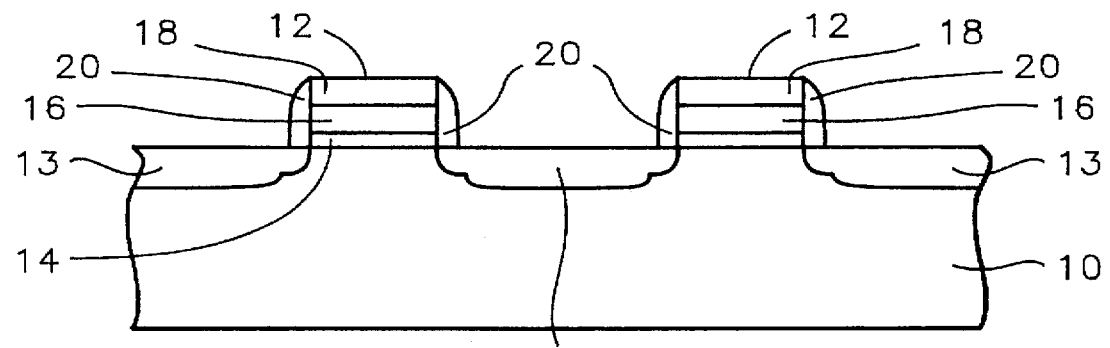
FIGS. 2 through 9 schematically illustrate in cross-sectional representation a preferred embodiment of the present invention.

Referring now more particularly to FIGS. 2 through 9, there is shown a portion of a partially completed integrated circuit having a monocrystalline semiconductor substrate 10. Gate electrodes 12 are formed as is conventional in the art and as illustrated in FIG. 2. Typically, gate electrodes 12 comprise a polysilicon layer 16 overlying gate oxide layer 14. A polycide layer 18 may complete the gate electrodes 12. Spacers 20 are formed by depositing silicon nitride or tetraethoxysilane (TEOS) oxide or the like over the surface of the substrate and anisotropically etching the layer 20 to form spacers on the sidewalls of the gate electrodes. Source and drain regions 13 are formed as is conventional in the art.

A dielectric layer 22, composed of TEOS, borophospho-TEOS, ozone-TEOS, or the like is deposited overlying the gate electrodes 12 and spacers 20 to a thickness of between about 1000 to 3000 Angstroms. This layer provides dielectric isolation.

The slope of the layer 22, less than about 30° from vertical, will promote the formation of stringers during subsequent bit line contact formation.

Figure 3:
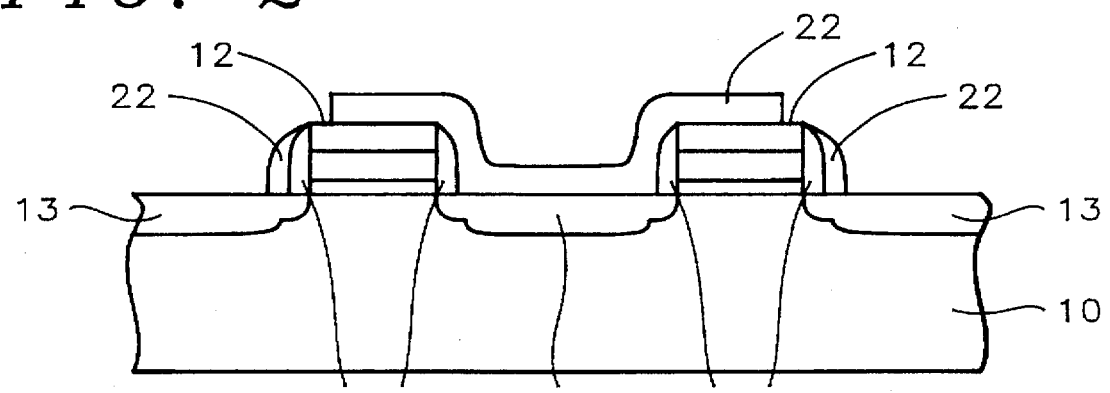
Figure 4:
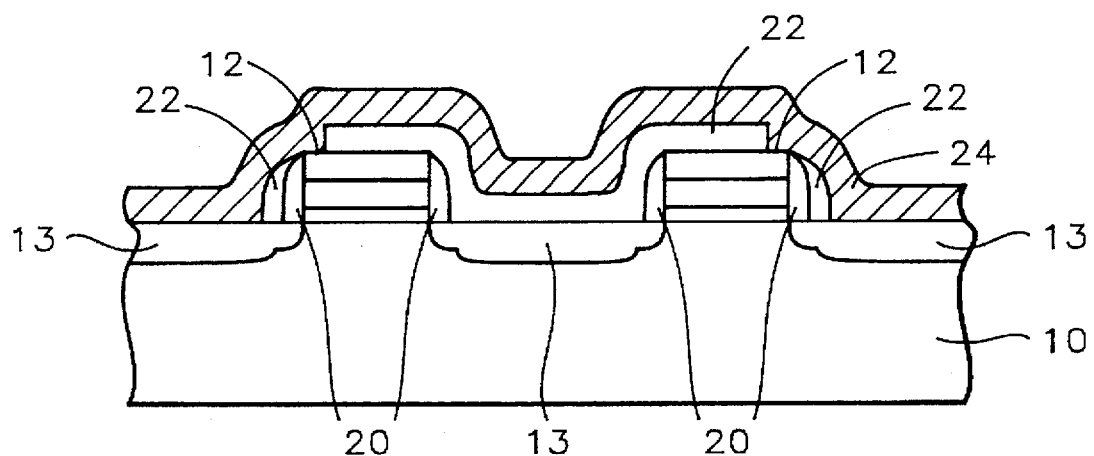

The key point of the present invention is to decrease the slope of layer 22. After the layer 22 has been patterned for the storage node contact, as shown in FIG. 3, a dielectric film 24 comprising silicon nitride, TEOS oxide, ozone-TEOS or the like is deposited overlying the layer 22, as shown in FIG. 4 to a thickness of between about 1000 and 3000 Angstroms.

Figure 5:
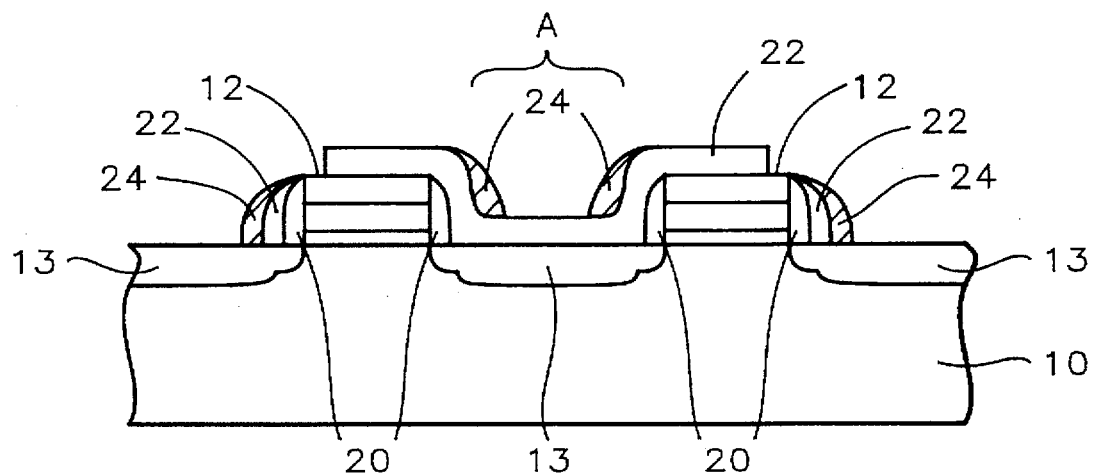

The silicon nitride layer 24 is anisotropically etched to leave spacers on the sidewalls of the gate electrodes, as shown in FIG. 5. This results in a more gentle slope in the area A. That is, a slope of more than about 40° from vertical.

Figure 6:
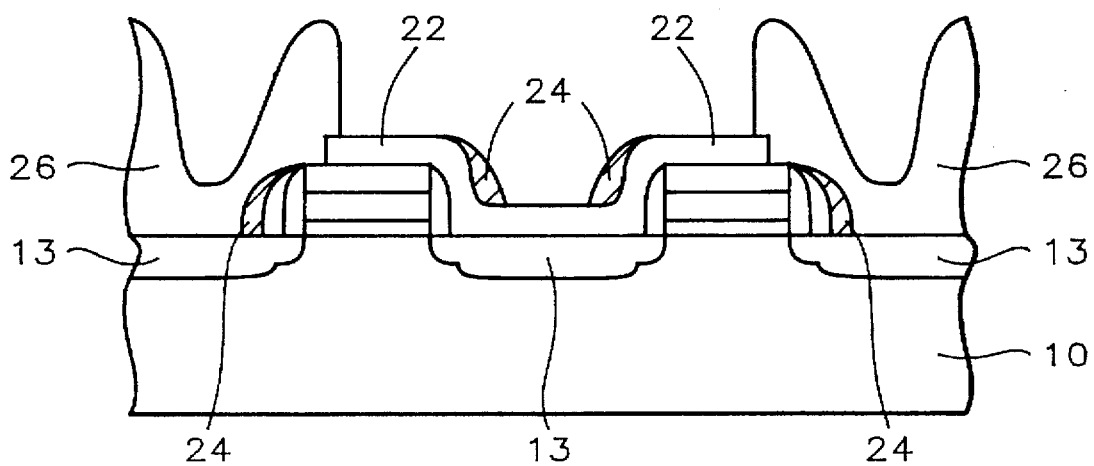

Referring now to FIG. 6, a second polysilicon layer 26 is deposited over the surface of the substrate to a thickness of between about 2500 to 5000 Angstroms and patterned as shown to form the bottom electrode of the capacitors.

Figure 7:
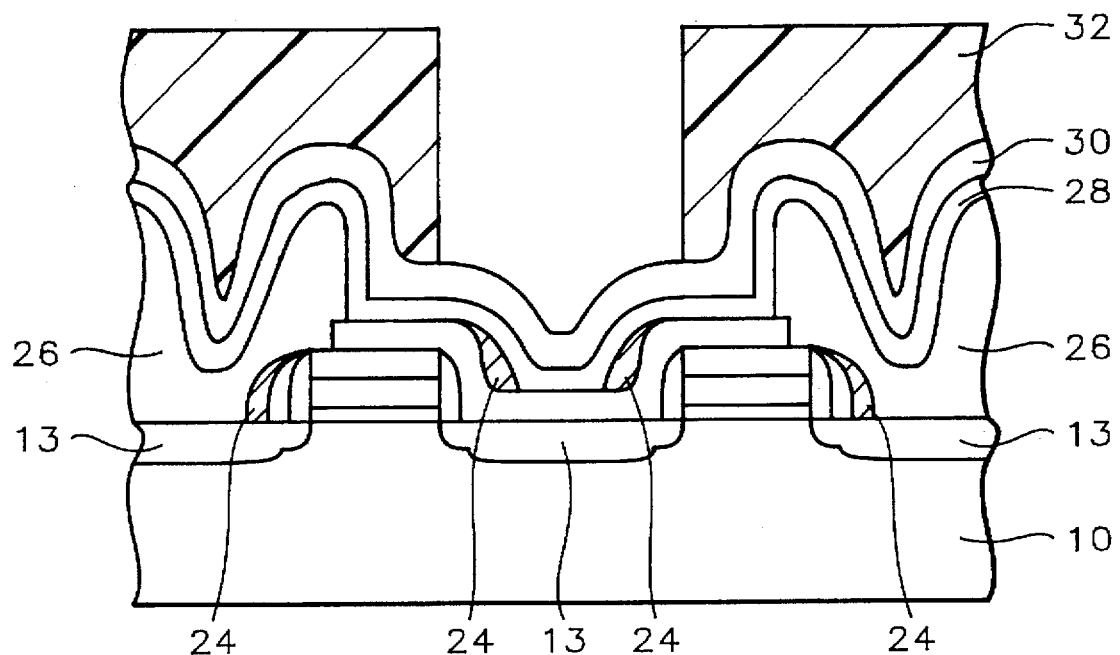

Referring now to FIG. 7, a capacitor dielectric layer 28 is deposited over the top surfaces of the substrate. This may be a layer of silicon oxide, silicon nitride, silicon oxide (ONO) having a thickness of between about 50 and 70 Angstroms. The third polysilicon layer 30 is deposited over the ONO layer 28 to a thickness of between about 1000 and 2000 Angstroms. The third polysilicon layer 30 forms the top electrode of the capacitors.

Referring now to FIG. 7, a layer of photoresist is coated over the surface and the substrate and patterned to form the photoresist mask 32 leaving an opening where the third polysilicon layer 30 is to be removed. This opening is larger than the bit line contact opening will be in order to prevent a short between the bit line contact and the third polysilicon layer.

Figure 1:
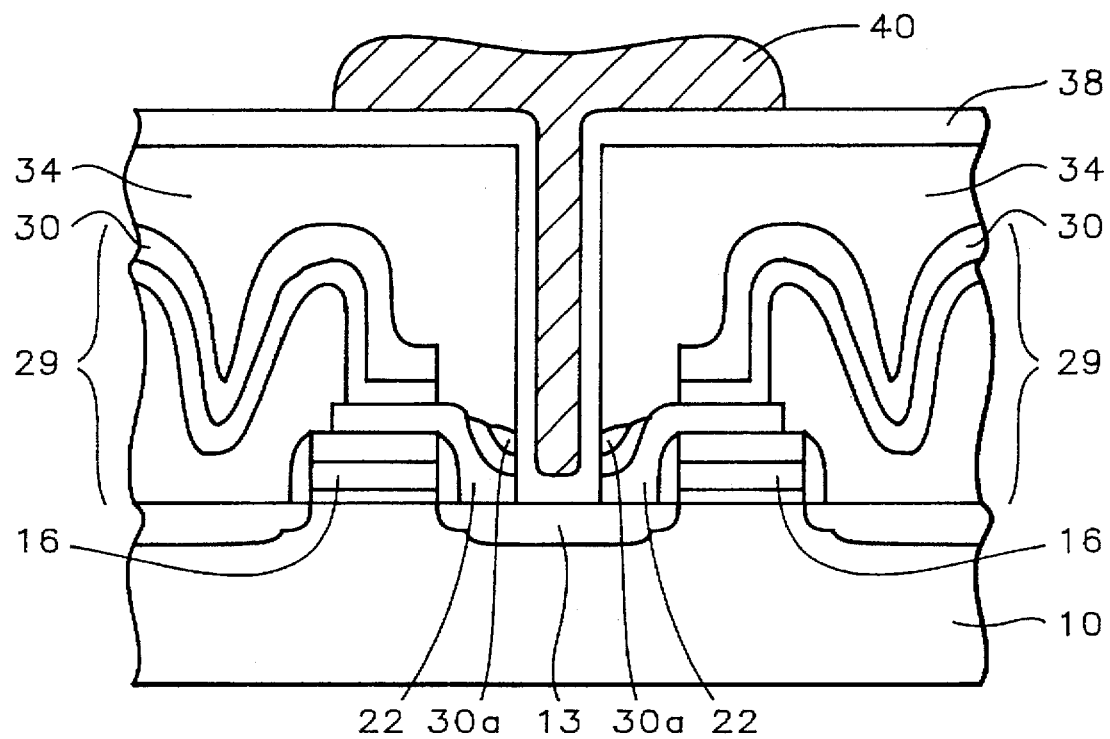
FIG. 1 schematically illustrates in cross-sectional representation a DRAM of the prior art.
Figure 8:
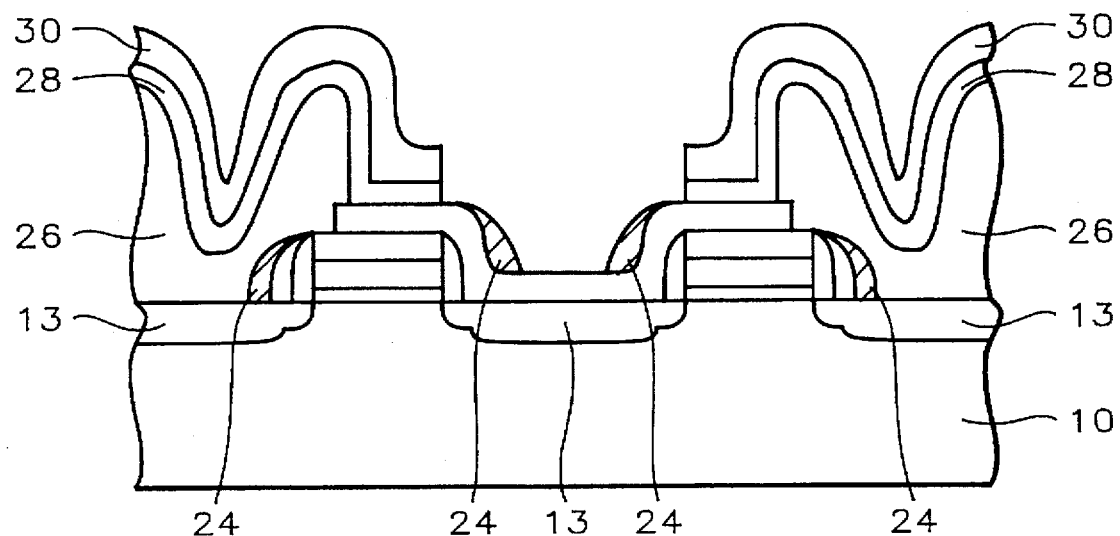

Referring now to FIG. 8, the third polysilicon layer 30 is etched away where it is not covered by the photoresist mask. The ONO 28 within the opening is also etched away. In the process of the prior art, this larger opening is not sufficient to prevent a short between the bit line and the polysilicon 30 because of the presence of the polysilicon stringers (30a shown in FIG. 1) that are not etched away within the opening. The gentler slope of the spacers 24 allows all of the polysilicon 30 within the opening to be etched away. In the prior art, stringers 30a are not etched away because of the steep slope of the dielectric 22.

Figure 9:
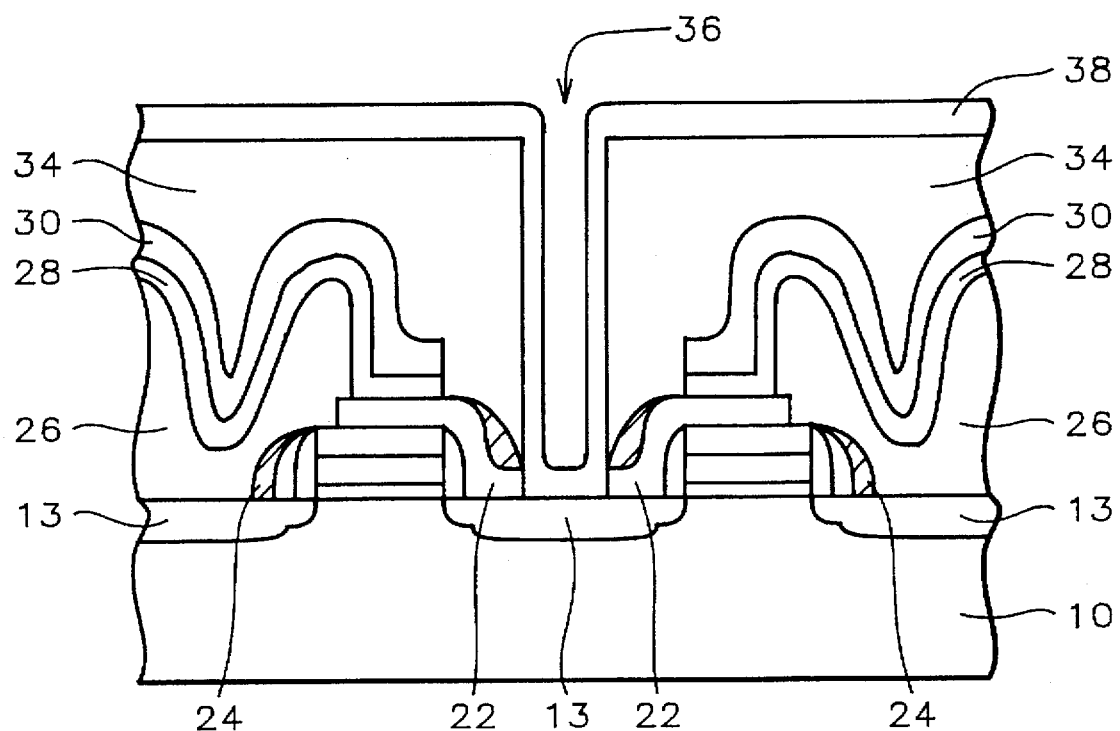

Referring now to FIG. 9, an interlevel dielectric layer 34 is deposited over the substrate. A bit line contact opening 36 is etched through the interlevel dielectric layer 34 and through the insulating layer 22 to the substrate over the source/drain region 13 to be contacted.

The bit line polysilicon layer 38 is deposited over the interlevel dielectric layer and within the bit line contact opening 36. The bit line conducting layer, such as aluminum 40, is deposited overlying the polysilicon layer 38 within the bit line contact opening and patterned to complete the bit line, as illustrated in FIG. 10.

The process of the invention prevents the formation of polysilicon stringers which would compromise the isolation between the bit line polysilicon 38 to the polysilicon 30. The process of the invention maintains the isolation between the bit line 38 and the polysilicon 30, as shown by the thickness B of the interlevel dielectric layer 34.

The interlevel dielectric layer 34 between the bit line and polysilicon 30 prevents lateral diffusion from the junction 13 to the polysilicon 30 and hence to the gate electrode 12.

Figure 10:
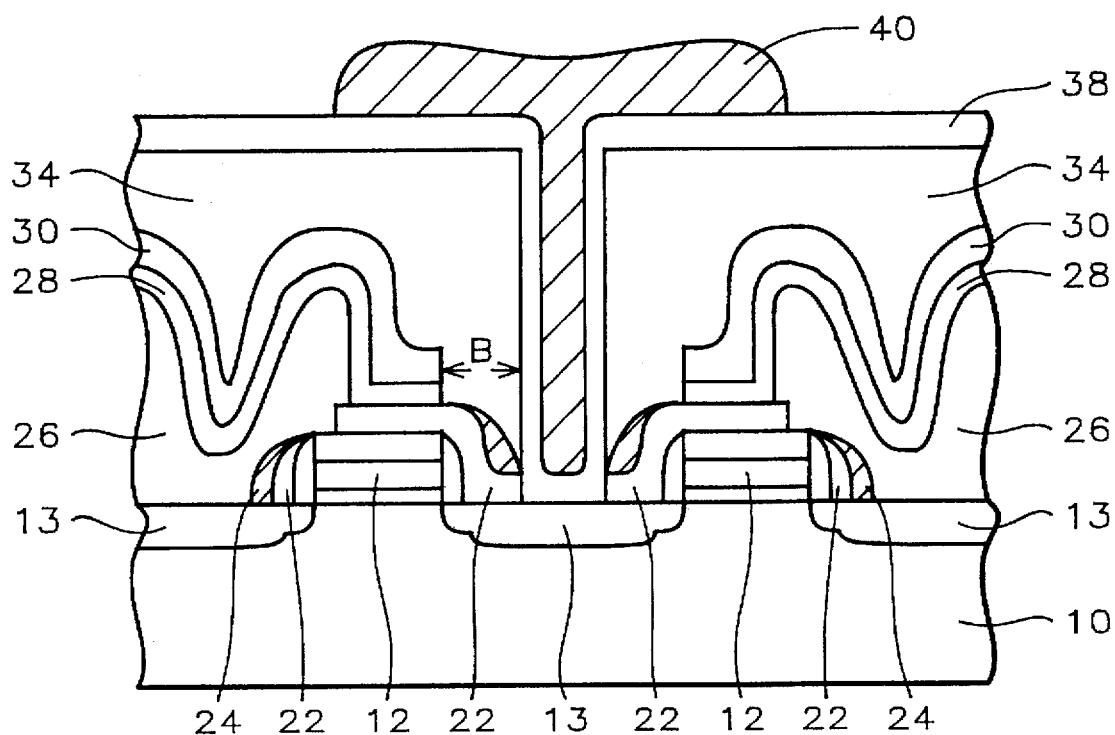
FIG. 10 schematically illustrates in cross-sectional representation a completed DRAM integrated circuit device fabricated by the process of the present invention.

FIG. 10 illustrates a cross-sectional view of the completed integrated circuit DRAM device with electrical connections. Gate electrodes 12 with associated source/drain regions 13 lie in and on a semiconductor substrate 10. Dielectric layer 22 overlies the gate electrodes. Capacitors partially overlie the gate electrodes 12 and dielectric layer 22. The capacitors comprise a bottom polysilicon electrode 26, capacitor dielectric layer 28 and top polysilicon electrode 30. Dielectric spacers 24 ease the slope of the dielectric 22. A bit line comprising a polysilicon layer 38 and a metal layer 40 extends through the insulating layer 34 to the source/drain region 13. The spacers 24 ease the slope of the dielectric 22 so that the polysilicon 30 is completely removed within the area of the bit line contact to preserve the bit line to gate isolation.

While the invention has been particularly shown and described with reference to the preferred embodiments thereof, it will be understood by those skilled in the art that various changes in form and details may be made without departing from the spirit and scope of the invention.

What is claimed is:

1. A method of forming a bit line contact in the fabrication of an integrated circuit device comprising:

depositing a first polysilicon layer on the surface of a semiconductor substrate and patterning said first polysilicon layer to form a gate electrode wherein said bit line contact is to be formed adjacent to said gate electrode;

forming a source/drain region associated with said gate electrode in said semiconductor substrate where said bit line contact is to be formed;

forming first spacers on the sidewalls of said gate electrode;

depositing a first insulating layer over said gate electrode and patterning said first insulating layer wherein said first insulating layer adjacent to said bit line contact has a first slope;

depositing a second insulating layer over said first insulating layer;

anisotropically etching said second insulating layer to leave second spacers on the sidewalls of said first insulating layer wherein said second spacers adjacent to said bit line contact have a second slope smaller than said first slope;

depositing a second polysilicon layer overlying said gate electrode and patterning said second polysilicon layer;

depositing a first dielectric layer over said second polysilicon layer;

depositing a third polysilicon layer overlying said first dielectric layer;

etching away said third polysilicon layer and said first dielectric layer where said bit line contact is to be formed;

depositing a second dielectric layer over said third polysilicon layer;

etching a bit line contact opening through said second dielectric layer and said first insulating layer to said underlying semiconductor substrate wherein said bit line contact opening is separated from said third polysilicon layer by a thickness of said second dielectric layer; and depositing a fourth polysilicon layer overlying said second dielectric layer and within said contact opening to form said bit line contact contacting said source/drain region in the fabrication of an integrated circuit device.

2. The method according to claim 1 wherein said first insulating layer comprises tetraethoxysilane (TEOS) oxide and has a thickness of between about 1000 and 3000 Angstroms.

3. The method according to claim 1 wherein said second insulating layer comprises silicon nitride having a thickness of between about 1000 and 3000 Angstroms.

4. The method according to claim 1 wherein said second insulating layer comprises TEOS oxide having a thickness of between about 1000 and 3000 Angstroms.

5. The method according to claim 1 wherein said second insulating layer comprises ozone-TEOS oxide having a thickness of between about 1000 and 3000 Angstroms.

6. The method according to claim 1 wherein said first slope is less than 30° from the vertical.

7. The method according to claim 1 wherein said second slope is greater than 40° from the vertical.

8. The method according to claim 1 wherein said second slope prevents the formation of stringers after said etching of said third polysilicon layer.

9. The method according to claim 1 wherein said patterned second polysilicon layer forms the bottom electrode of a capacitor, said first dielectric layer is a capacitor dielectric, and said third polysilicon layer forms the top electrode of said capacitor.

10. A method of forming a bit line contact in the fabrication of a DRAM integrated circuit device comprising:

depositing a first polysilicon layer on the surface of a semiconductor substrate and patterning said first polysilicon layer to form a gate electrode wherein said bit line contact is to be formed adjacent to said gate electrode;

forming first spacers on the sidewalls of said gate electrode;

depositing a first insulating layer over said gate electrode and patterning said first insulating layer wherein said first insulating layer adjacent to said bit line contact has a first slope;

depositing a second insulating layer over said first insulating layer;

anisotropically etching said second insulating layer to leave second spacers on the sidewalls of said first insulating layer wherein said second spacers adjacent to said bit line contact have a second slope less than said first slope;

depositing a second polysilicon layer overlying said gate electrode;

patterning said second polysilicon layer to form the bottom electrode of a capacitor;

depositing a capacitor dielectric layer over said second polysilicon layer;

depositing a third polysilicon layer overlying said capacitor dielectric layer;

etching away said third polysilicon layer and said capacitor dielectric layer where said bit line contact is to be formed wherein said third polysilicon layer forms the top electrode of said capacitor;

depositing a second dielectric layer over said third polysilicon layer;

etching a bit line contact opening through said second dielectric layer and said first insulating layer to said underlying semiconductor substrate wherein said bit line contact opening is separated from said third polysilicon layer by a thickness of said second dielectric layer;

depositing a fourth polysilicon layer overlying said second dielectric layer and within said contact opening; and filling said contact opening with a bit line conducting material to complete formation of said bit line contact in the fabrication of a DRAM integrated circuit device.

11. The method according to claim 10 wherein said first insulating layer comprises TEOS oxide and has a thickness of between about 1000 and 3000 Angstroms.

12. The method according to claim 10 wherein said second insulating layer comprises silicon nitride having a thickness of between about 1000 and 3000 Angstroms.

13. The method according to claim 10 wherein said second insulating layer comprises TEOS oxide having a thickness of between about 1000 and 3000 Angstroms.

14. The method according to claim 10 wherein said second insulating layer comprises ozone-TEOS oxide having a thickness of between about 1000 and 3000 Angstroms.

15. The method according to claim 10 wherein said first slope is less than 30° from the vertical.

16. The method according to claim 10 wherein said second slope is greater than 40° from the vertical.

17. The method according to claim 10 wherein said second slope prevents the formation of stringers after said etching of said third polysilicon layer.

18. The method according to claim 10 wherein said bit line contacts a source/drain region within said semiconductor substrate.

* * * * *